United States Patent
Blair et al.

(10) Patent No.: US 7,244,664 B2
(45) Date of Patent: Jul. 17, 2007

(54) METHOD FOR DICING AND SINGULATING SUBSTRATES

(75) Inventors: David B. Blair, Blue Ridge, TX (US); Leon Stiborek, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 287 days.

(21) Appl. No.: 10/974,247

(22) Filed: Oct. 27, 2004

(65) Prior Publication Data

US 2005/0095816 A1 May 5, 2005

Related U.S. Application Data

(60) Provisional application No. 60/515,584, filed on Oct. 30, 2003.

(51) Int. Cl.
*H01L 21/301* (2006.01)

(52) U.S. Cl. ..................... 438/460; 438/465

(58) Field of Classification Search .............. 438/460
See application file for complete search history.

(56) References Cited

U.S. PATENT DOCUMENTS

| | | | |
|---|---|---|---|
| 5,786,266 A * | 7/1998 | Boruta | 438/462 |
| 5,989,982 A * | 11/1999 | Yoshikazu | 438/462 |
| 5,997,597 A * | 12/1999 | Hagan | 51/309 |
| 6,291,317 B1 * | 9/2001 | Salatino et al. | 438/462 |
| 6,420,245 B1 | 7/2002 | Manor | |
| 6,659,843 B2 * | 12/2003 | Boucher et al. | 451/12 |

| | | | |
|---|---|---|---|
| 2002/0157657 A1 | 10/2002 | Toledano | |

FOREIGN PATENT DOCUMENTS

| | | | |
|---|---|---|---|
| JP | 2001-217211 | * | 8/2001 |
| JP | 2005-243947 | * | 9/2005 |

OTHER PUBLICATIONS

Nova "A Hub Blade Solution for Dicing Low-K Type Wafers"; Kulicke & Soffa 2003.
Hanxie Zhoa, et al.; "Process Challenges in Low-K Wafer Dicing"; SEMI Technical Symposium "STS:IEMT Poster Session"; Jul. 16, 2003, 5 Pages.

* cited by examiner

*Primary Examiner*—M. Wilczewski
*Assistant Examiner*—Pamela E Perkins
(74) *Attorney, Agent, or Firm*—Yingsheng Tung; Wade James Brady, III; Frederick J. Telecky, Jr.

(57) ABSTRACT

The present invention provides, in one embodiment, a semiconductor wafer (100) dicing process. The dicing process comprises removing circuit features (120) from a street (115) located between dies (105) on a semiconductor substrate (102) using a first blade (135), such that the semiconductor substrate is exposed, and cutting through the exposed semiconductor substrate using a second blade (190). The first blade has a surface (140) coated with an abrasive material (145) comprising grit particles (150), having a median diameter (155) of at least about 25 microns. The grit particles are adhered to the first blade with a bonding agent (160) having a hardness of about 80 or less (Rockwell B Hardness scale). The grit particles have a concentration in the bonding agent ranging from about 25 to about 50 vol %. Another embodiment of the invention is a method of manufacturing a semiconductor device (200).

19 Claims, 7 Drawing Sheets

METHOD FOR DICING AND SINGULATING SUBSTRATES

CROSS-REFERENCE TO RELATED APPLICATION

This application claims the benefit of U.S. Provisional Application No. 60/515,584 of the same title, to David Bruce Blair and Leon Stiborek, filed on Oct. 30, 2003.

TECHNICAL FIELD OF THE INVENTION

The present invention is directed, in general, to a method of fabricating semiconductor devices, and in particular, the singulation of dies from a semiconductor wafer.

BACKGROUND OF THE INVENTION

Singulation, the process of separating a semiconductor wafer substrate into individual integrated circuit dies, is an essential procedure in semiconductor device manufacturing. Numerous methods can be used to achieve singulation including: laser cutting, scribe and break, routing, dicing or combinations thereof. One of the most commonly used methods for singulation is dicing. Dicing refers to cutting the wafer substrate along a street or kerf located between the dies via mechanical grinding with a rotating blade.

Shrinking integrated circuit geometries and the introduction of new materials into integrated circuit designs are present new challenges to existing singulation technologies. To facilitate faster device operating speeds and reduced power consumption, present and future generations of integrated circuits have decreasingly smaller circuit features and multiple layers of transistors, metalization and insulators made of low dielectric constant materials (e.g., dielectric constant less than ~4). Unfortunately, the insulating layers of low dielectric constant materials have weak mechanical strength and poor adhesion to other layers of the integrated circuit. Moreover, to further improve integrated circuit performance, traditional silicon-based semiconductor wafers are being replaced by more fragile materials. Small multilayered circuit geometries on fragile substrate wafers are highly susceptible to peeling and chipping during conventional singulation. Reduced yields of high quality functional semiconductor devices, due to peeling and chipping of the integrated circuit dies, can significantly increase semiconductor device manufacturing costs.

Previous efforts to reduce the occurrence of peeling and chipping during singulation are not entirely satisfactory. Traditionally, seal rings, comprising metal lines, are formed around the perimeter of each die. Although the seal rings act as a barrier to help prevent micro-cracks from encroaching into dies during singulation, there can still be substantial losses of dies due to cracking and peeling under the seal ring. In other instances, singulation involves a combination of laser ablation and dicing. A laser ablation step fuses the circuit feature layers together, creating a metalized border along the streets. The metalized borders supplement the function of metal seal rings to further reduce micro-crack formation during a subsequent dicing step, to complete the separation of the wafer into individual dies. Laser ablation, however, can cause thermal damage to integrated circuits, resulting in lower yields of functional devices. In addition, laser ablation tools are substantially more expensive than dicing tools, thereby adding significant costs to the manufacture of semiconductor devices. Furthermore, semiconductor device production throughput is decreased because a semiconductor wafer ready for singulation has to be transferred to a laser ablation tool, and then transferred to a dicing tool.

Accordingly, what is needed in the art is an inexpensive method of manufacturing semiconductor devices that minimizes the losses of integrated circuits from chipping and peeling of dies during singulation.

SUMMARY OF THE INVENTION

To address the above-discussed deficiencies of the prior art, one embodiment of the present invention provides a semiconductor wafer dicing process. The dicing process comprises removing circuit features from a street located between dies on a semiconductor substrate using a first blade, such that the semiconductor substrate is exposed. The exposed semiconductor substrate is cut through using a second blade. The first blade has a surface coated with an abrasive material comprising grit particles, having a median diameter of at least about 25 microns. The grit particles are adhered to the blade with a bonding agent having a hardness of about 80 (Rockwell B Hardness scale) or less. The grit particles have a concentration in the bonding agent ranging from about 25 to about 50 vol %.

Another embodiment is a method of manufacturing a semiconductor device. The method includes forming one of more integrated circuits on a semiconductor substrate, including forming circuit features over the semiconductor substrate. The method further includes singulating the integrated circuits into dies. Singulation comprises removing the circuit features from a street located between the dies using a first blade as described above, such that the semiconductor substrate is exposed, and cutting through the exposed semiconductor wafer using a second blade.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention provides a new process for dicing semiconductor wafers that yields integrated circuit dies having substantially less peeling and cracking as compared to conventional dicing processes. Significantly, the yield of integrated circuit dies without peeling and cracking is at least as good as that obtained using a combination of laser ablation and dicing. The ability to perform singulation entirely with existing dicing tools represent a substantial saving of cost and time because laser ablation is not needed.

In the present invention, circuit features on the semiconductor wafer substrate are removed from streets by dicing using a first blade. Then, the semiconductor wafer substrate itself is cut through the streets using a second blade. It has been discovered that certain properties of the first blade facilitate the preparation of high quality dies. Specifically, a low concentration of large abrasive grits embedded in a soft bonding agent promotes the singulation of dies with substantially no cracks or peeling in the vicinity of the street being diced.

While not limiting the scope of the present invention by theory, it is thought that waste material, produced from the grinding of integrated circuit features off the street, can adhere to conventional dicing blades. It is postulated that the ability of dicing blades covered with such waste material to provide a high-quality cut is substantially compromised as compared to the blade in its virgin state. Moreover, it is believed that the above-described combination of first blade properties in the present invention cooperate to efficiently remove soft waste material from the edge of the blade, and that this helps reduce cracking and peeling during dicing.

Several of the above-described properties of the blade of the present invention are either contrary to conventional thinking, or not considered being important, to improving the quality of dicing. Conventional wisdom is that smaller sized grit particles (e.g., about 5 micron median diameter or less) provide a finer smoother cut and thereby reduces peeling and cracking. Likewise, it is traditionally believed that a higher concentration (e.g., over about 50 vol %) of grit particles is conducive to a finer, more uniform cut.

Figure 1A:
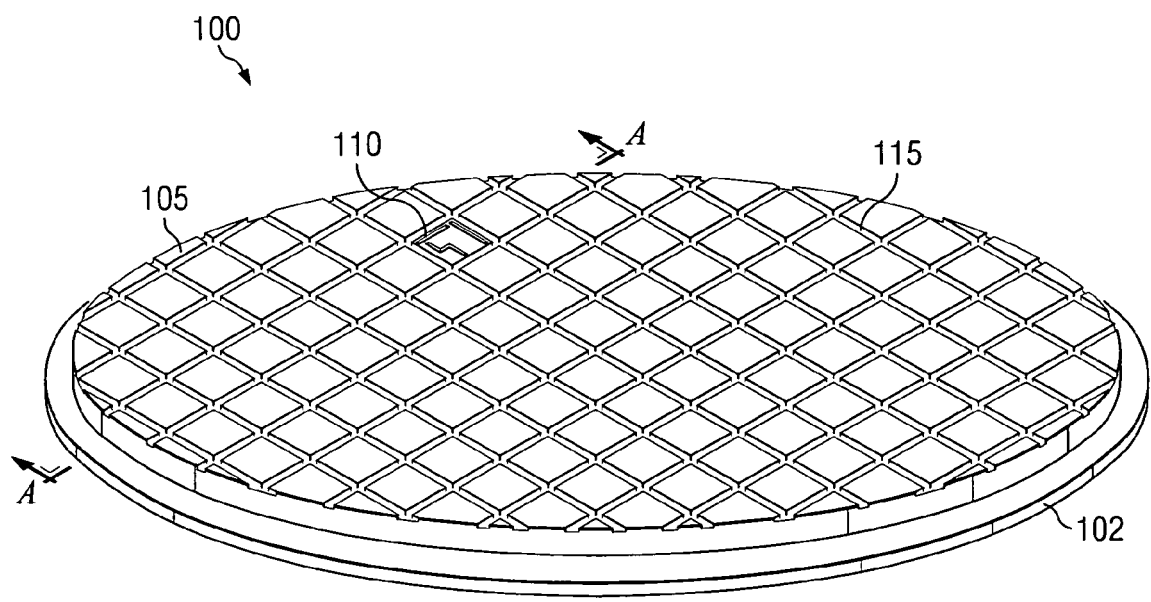
FIGS. 1A-1D illustrate views of a semiconductor wafer at selected steps in an exemplary dicing process according to the principles of the present invention.

One embodiment of the present invention is a semiconductor wafer dicing process. FIGS. 1A-1D illustrate views of a semiconductor wafer at selected steps in an exemplary dicing process according to the principles of the present invention. Turning first to FIG. 1A, shown is a perspective view of a semiconductor wafer 100 comprising a semiconductor substrate 102 divided into dies 105. Semiconductor devices 110 are on the dies 105 and streets 115 are between the dies 105.

Figure 1B:
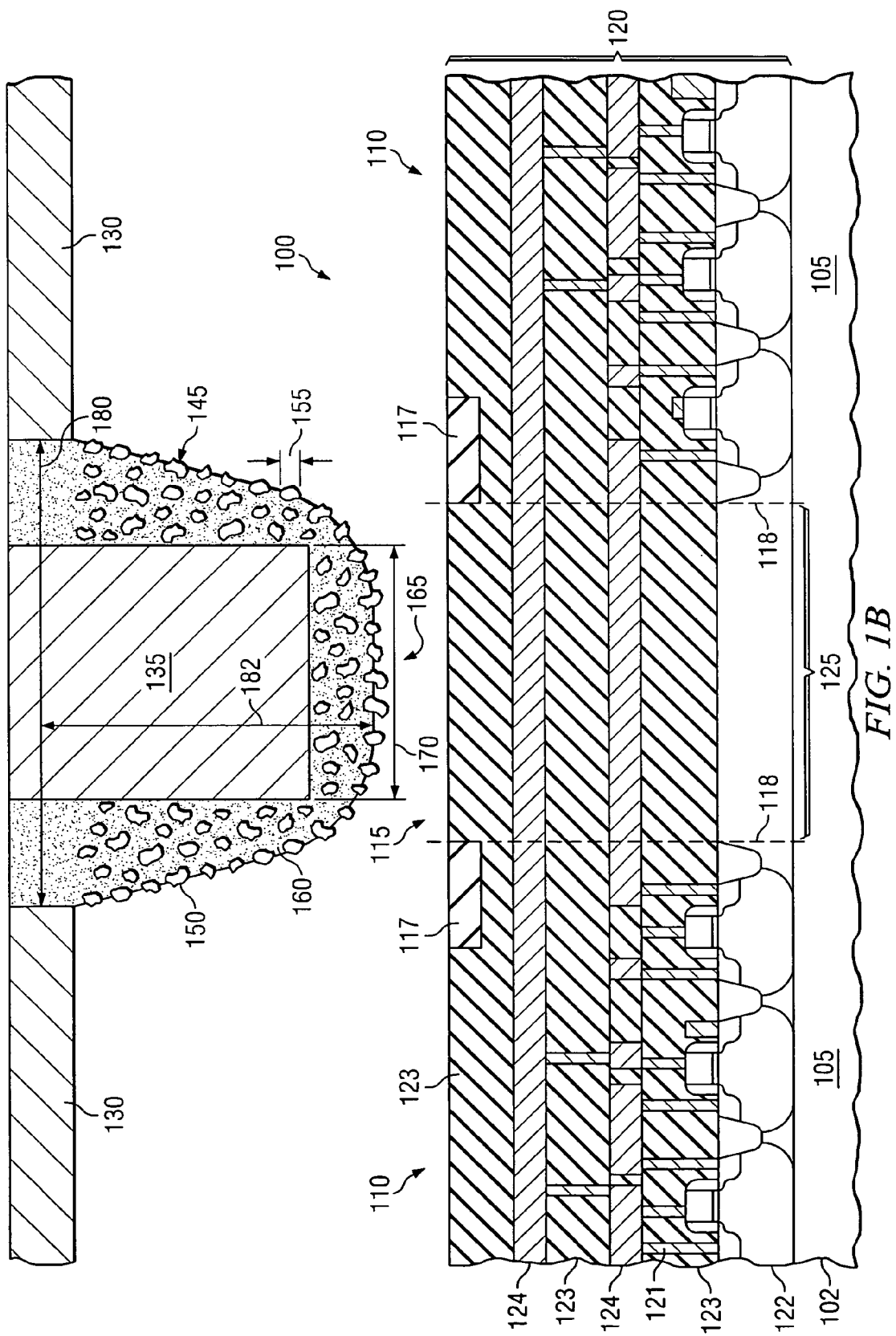

Referring now to FIG. 1B, shown is a cross-sectional view of a portion of the semiconductor wafer 100 through membranous section A-A depicted in FIG. 1A. As illustrated in FIG. 1B, in some cases, seal rings 117 demarcate the perimeter 118 of the streets 115, and circuit features 120 are located over the semiconductor substrate 102. The term circuit feature 120 as used herein, refers to interconnects 121, transistors 122, insulating layers 123 and metal layers 124. The circuit features 120 are located within the dies 105, forming the semiconductor devices 110, such as integrated circuits. In addition, aspects of the circuit features 120 are also located in the streets 115.

The streets 115 define a portion 125 of the circuit feature 120 destine to be removed using a dicing tool 130. Any conventional dicing tool 130 can be used to singulate the semiconductor wafer 100. The dicing tool 130 includes a first blade 135. The first blade 135, preferably having an annular shape, has a surface 140 coated with an abrasive material 145 comprising grit particles 150, preferably made of diamonds. The grit particles 150 have a median diameter 155 of at least about 25 microns, and in some preferred embodiments, from about 25 microns to about 40 microns. The grit particles 150 are adhered to the first blade 135 with a bonding agent 160 having a hardness of about 80 (Rockwell B Hardness scale) or less. The grit particles 150 have a concentration ranging from about 25 to about 50 vol % in the bonding agent 160. More preferably, the concentration is ranges from about 30 to about 40 vol %.

A soft bonding agent 160 facilitates the removal of eroded grit particles 150 and exposure of grit particles 150 embedded within the bonding agent 160. In some preferred embodiments, the bonding agent 160 has a hardness ranging from about 68 to about 80 (Rockwell B Hardness scale). The bonding agent 160 can comprise a metal, such as a bronze alloy. In some cases, the bronze alloy comprises from about 20 to about 35 wt % tin, from about 0 to about 3 wt % silicon, and balance copper (about 62 to about 80 wt %). In certain preferred embodiments, the bronze alloy comprises about 72 wt % copper, 27 wt % tin and about 1 wt % silicon. In other embodiments, however, the bonding agent 160 comprises a high temperature resin, such as a phenolic resin.

In certain cases, as illustrated in FIG. 1B, it is advantageous for the first blade 135 to have a grinding surface 165 that is beveled, while in other instances, the grinding surface 165 is flat. In some embodiments, the grinding surface 165 has a width 170 of about 40 microns. Of course, this width 170 can be adjusted to fit within the street 115 for the particular semiconductor wafer 100 being diced.

A blade's width 170 has not been previously considered to be important to the quality of dicing. However, as part of the present invention, it was discovered that it is advantageous to increase the internal width 180 of the first blade 135 to increase the blade's rigidity. A blade 135 having a large internal width 180 is thought to advantageously stabilize the blade 135 during dicing by increasing its rigidity. An increase in rigidity, in turn, reduces the extent of blade vibration or chatter during dicing, thereby decreasing cracking and peeling of the dies. For the purposes of the present invention, internal width 180 is defined as the blade's width at a remote distance 182 (e.g., at least about 1000 microns) from the grinding surface 165. In certain advantageous embodiments, for instance, the first blade 135 has an internal width 180 of about 300 microns.

Figure 1C:
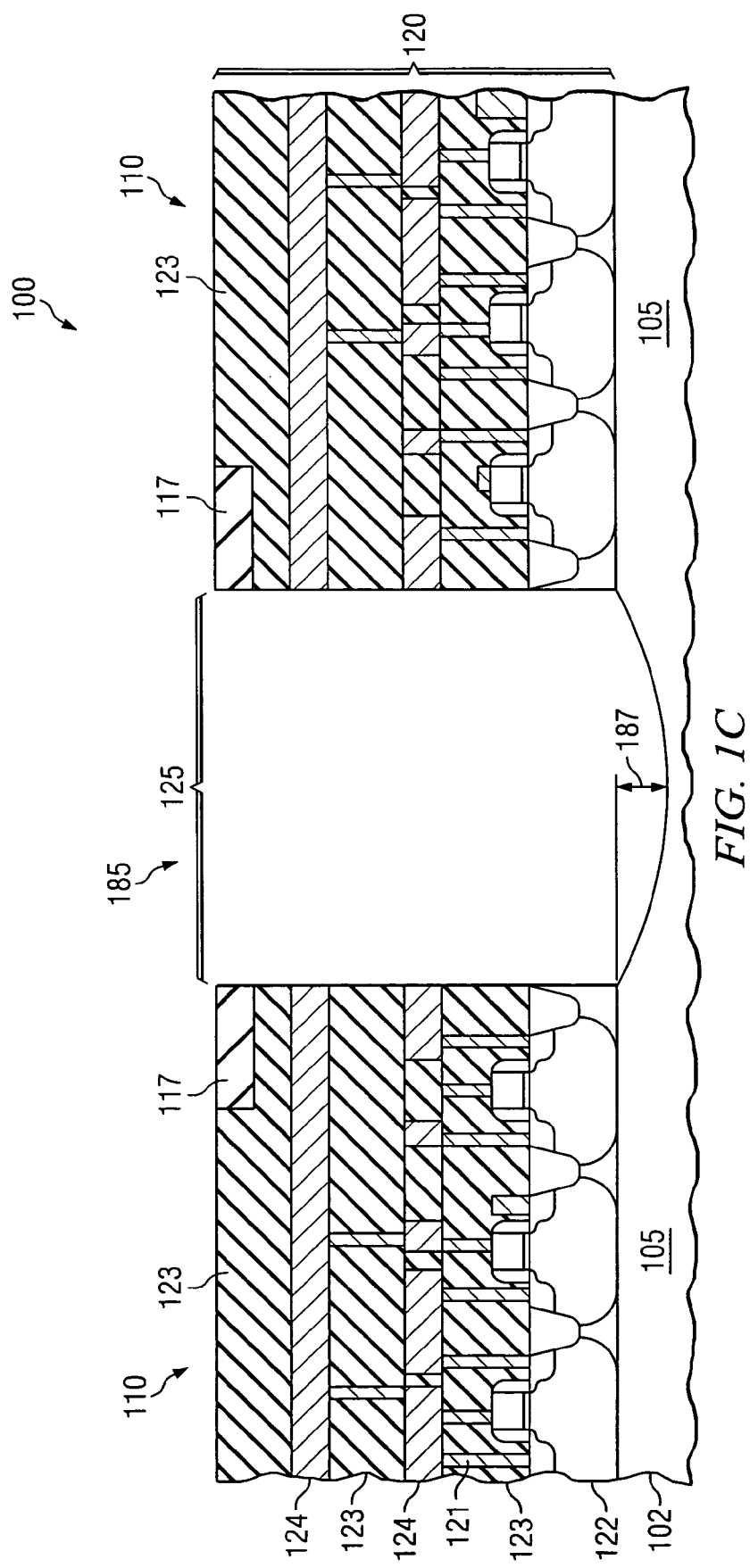

FIG. 1C presents a cross-sectional view the semiconductor wafer 100 after removing the portion 125 of the circuit features 120 from the street 115 located between dies 105 using the first blade 135 depicted in FIG. 1B. This results in the exposure of a portion 185 of the semiconductor substrate 102. In certain embodiments of the process, a thickness 187 of the exposed portion 185 of the semiconductor substrate 102 is removed by the first blade 135. It is desirable to minimize the removal of the semiconductor substrate 102 using the first blade 135 because this can create microcracks in the semiconductor wafer 100, thereby reducing device yields. For example, in some preferred embodiments the thickness 187 of the exposed portion 185 removed is less than about 5 microns.

Figure 1D:
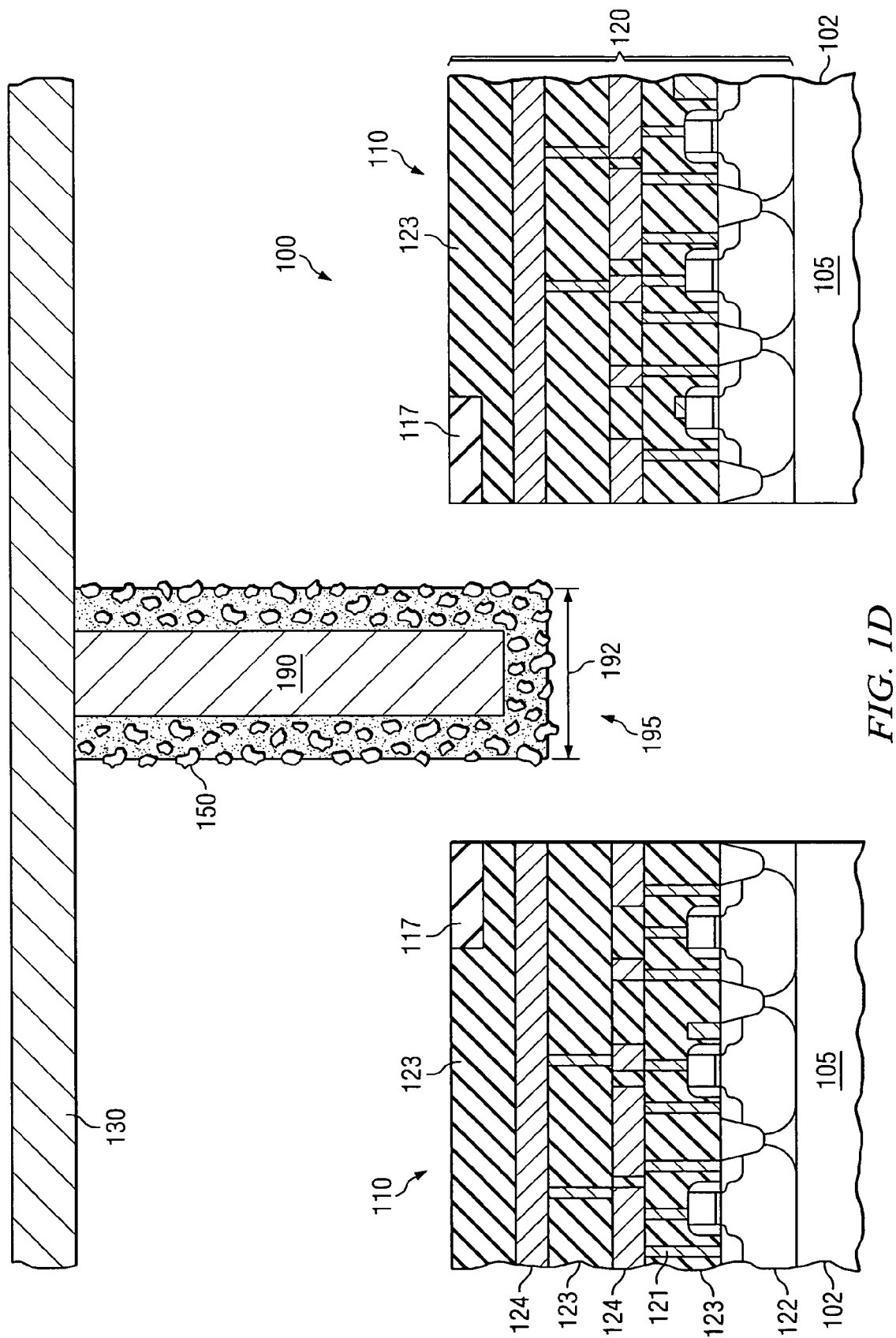

Turning now to FIG. 1D, illustrated is a cross-sectional view of the semiconductor wafer 100 after cutting the exposed portion 185 of semiconductor substrate 102, shown in FIG. 1C, using a second blade 190. The second blade 190 can be any conventional blade used for semiconductor wafer dicing. To facilitate tracking, the width 192 of the cutting surface 195 of the second blade 190 is preferably less than the width 170 of the grinding surface 165 of the first blade 135 depicted in FIG. 1B. Preferably, the width 192 of the cutting surface 195 is at least about 50 percent, and even more preferably 90 percent, less than the width 170 of the first blade 135. In some embodiments, the cutting surface 195 is beveled, while in other cases the cutting surface 195 is flat, similar to that shown in FIG. 1D.

Figure 2A:
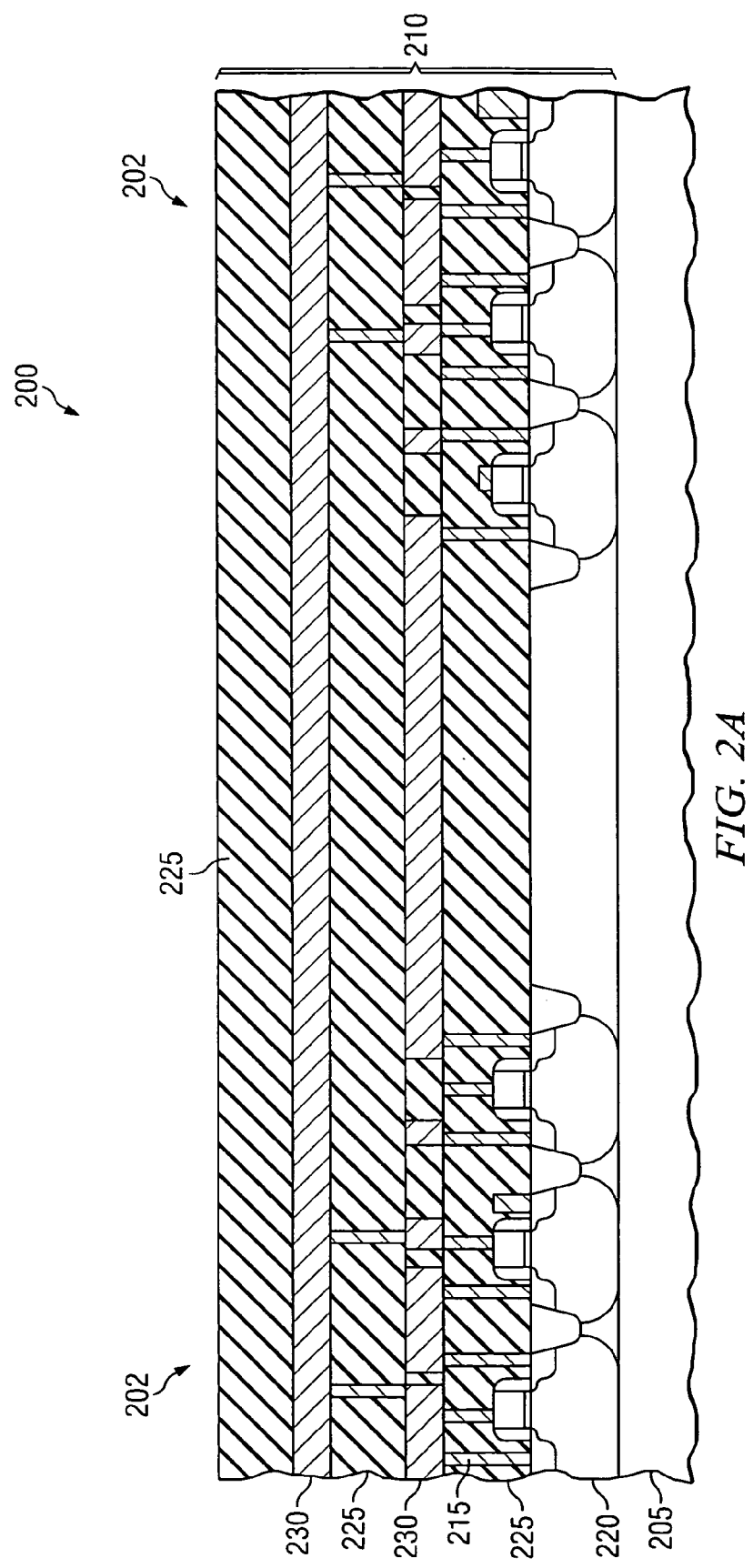
FIGS. 2A to 2C illustrate cross-sectional views of selected steps in an exemplary method of manufacturing a semiconductor device according to the principles of the present invention.
Figure 2B:
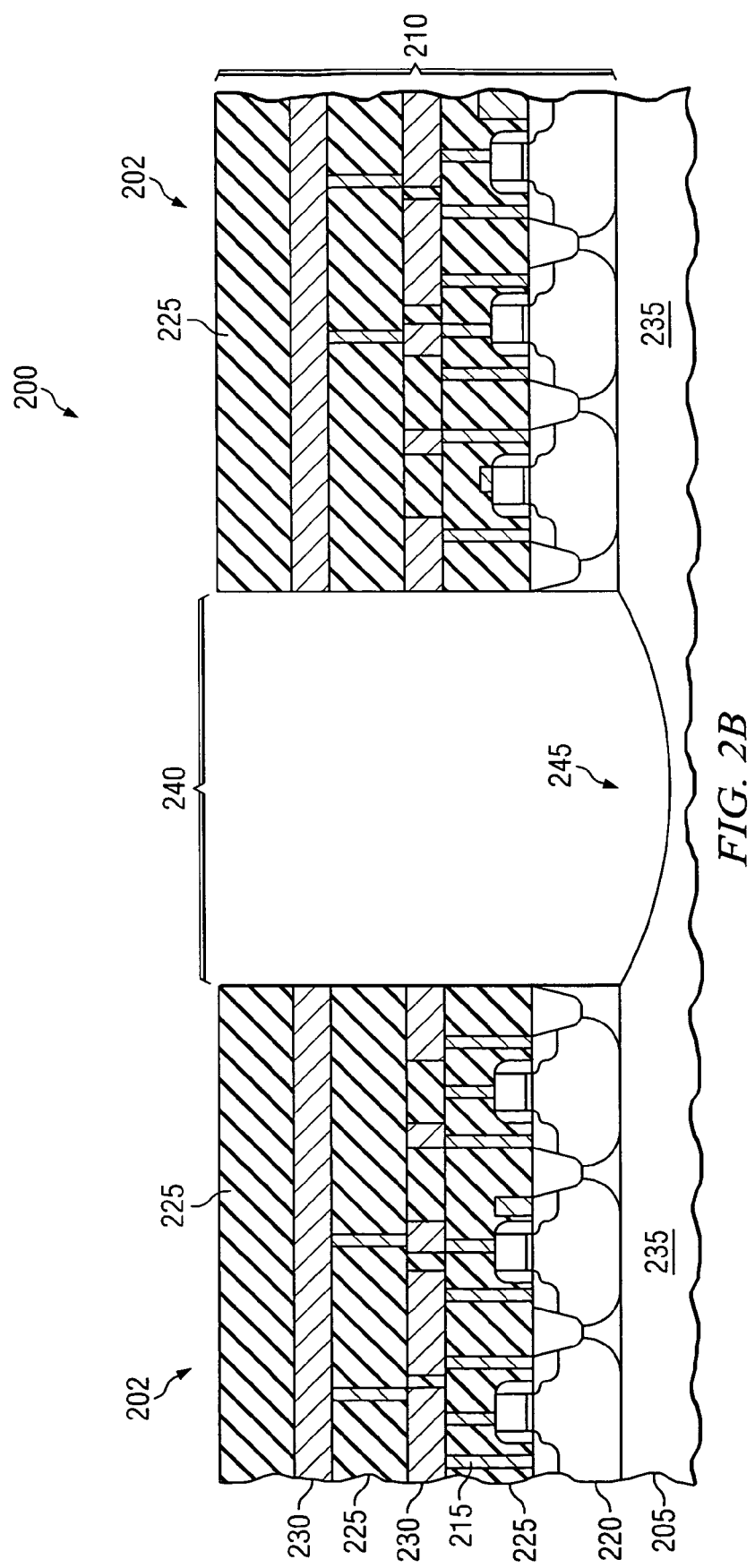
Figure 2C:
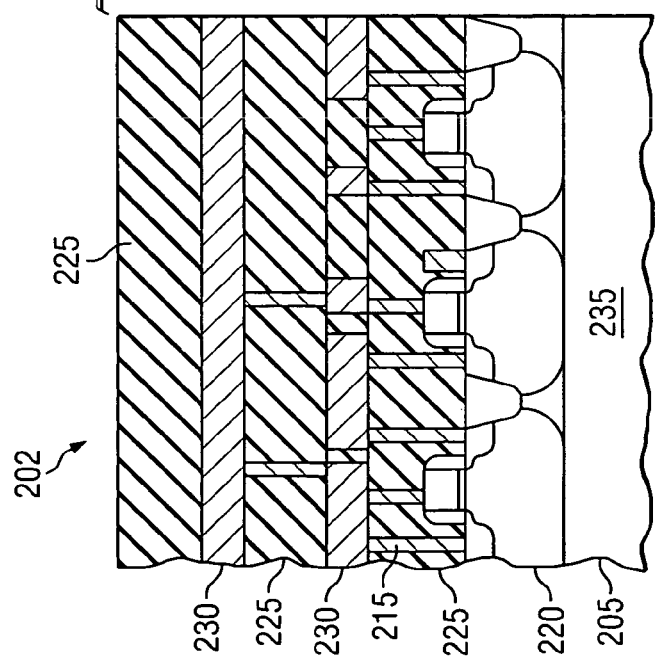

Another aspect of the present invention is a method of manufacturing a semiconductor device. FIGS. 2A-2C illustrate cross-sectional views of selected steps in an exemplary method of manufacturing a semiconductor device 200. Turning first to FIG. 2A, illustrated is the partially completed semiconductor device 200 after forming one or more integrated circuits 202 on a semiconductor substrate 205. Any conventional method can be used to fabricate the integrated circuits 202, including forming circuit features 210 over the semiconductor substrate 205. For instance, conventional photolithography, dopant implantation, chemical vapor and electrochemical deposition, and chemical mechanical polishing procedures can be used to form interconnects 215, transistors 220, insulating layers 225, and metal layers 230 that comprise the integrated circuits 202.

The semiconductor substrate 205 can be made of any convention material in the microelectronics industry, including silicon, sapphire, garnet, alumina, ceramic, glass, quartz, or ferrite. The transistors 215 of the integrated circuits 202 can include metal oxide semiconductor (MOS) transistors, bipolar transistors, or other conventional transistors. The metal layers 230 of the integrated circuits 202 can be made of tungsten, copper, gold or other conventional metals. Some preferred integrated circuits 202 have one or more insulating layers 225 comprising a low K dielectric material deposited by spin coating, chemical vapor deposition or other conventional procedures. The term dielectric constant as used herein refers to the multiplicative factor of the dielectric constant of the material of interest, as compared to the dielectric constant of air (about $8.85 \times 10^{-14}$ Farads/cm). The term low K dielectric material as used herein refers to a material whose dielectric constant relative to air is less than about 4. Examples of suitable low K dielectric materials include spin-on glass, organic silicate glass, or fluorosilicate glass. Of course, the insulating layers 225 can comprise layers of silicon dioxide deposited from tetraethyl orthosilicate (TEOS) by conventional methods.

FIGS. 2B and 2C illustrate singulating the integrated circuits 202 into dies 235. Any embodiments of the dicing process discussed above can be used to singulate the integrated circuits 202. Referring first to FIG. 2B, illustrated are the integrated circuits 202 after removing the circuit features 210 from a street 240 located between the dies 235, such that a portion 245 of the semiconductor substrate 205 is exposed. Removal of the circuit features 210 is achieved using a first blade having the properties described above and illustrated in FIG. 1B. Turning now to FIG. 2C, singulation is completed by cutting through the exposed portion 245 of the semiconductor substrate 205 using a second blade having the properties described above and illustrated in FIG. 1D.

One skilled in the art would understand that the integrated circuits 202 and singulated dies 235 can be further processed using conventional front-end procedures to complete the manufacture of the semiconductor device 200. Such front-end procedures can include die attachment to a lead frame substrate, wiring bonding to connect the integrated circuits 202 to the lead frame, and molding or hermetic packing to encapsulate and thereby protect the integrated circuits 202 from the environment.

Although the present invention has been described in detail, one of ordinary skill in the art should understand that they can make various changes, substitutions and alterations herein without departing from the scope of the invention.

What is claimed is:

1. A semiconductor wafer dicing process, comprising:
   removing circuit features from a street located between dies on a semiconductor substrate such that said semiconductor substrate is exposed, wherein;
   said removing is achieved using a first blade of a first grinding surface width, having a surface coated with an abrasive material comprising grit particles having a first median diameter;
   and
   cutting through said exposed semiconductor substrate using a second blade of a second grinding surface width smaller than the first grinding surface width, having a surface coated with an abrasive material comprising grit particles having a second median diameter smaller than the first median diameter.

2. The process recited in claim 1, wherein said first blade has a grinding surface width of about 40 microns.

3. The process recited in claim 2, wherein said grinding surface is beveled.

4. The process recited in claim 1, wherein said first blade has an internal width of about 300 microns.

5. The process recited in claim 1, wherein said grit particles comprise diamonds.

6. The process recited in claim 1, wherein said first median diameter ranges from about 25 microns to about 40 microns.

7. The process recited in claim 1, wherein said grit particles being adhered to said first blade with a bonding agent having a hardness and said hardness ranges from about 68 to about 80 (Rockwell B Hardness scale).

8. The process recited in claim 7, wherein said grit particles have a concentration in the bonding agent ranges from about 30 vol % to about 40 vol %.

9. The process recited in claim 7, wherein said bonding agent comprises a metal.

10. The process recited in claim 9, wherein said bonding agent comprises a bronze alloy.

11. The process recited in claim 10, wherein said bronze alloy comprises from about 20 to about 35 wt% tin, from about 0 to about 3 wt % silicon and balance copper.

12. The process recited in claim 10, wherein said bronze alloy comprises about 72 wt % copper, 27 wt % tin and about 1 wt % silicon.

13. The process recited in claim 7, wherein said bonding agent comprises a high temperature phenolic resin.

14. The process recited in claim 1, wherein the second grinding surface width is at least about 50 percent less than said width of said first grinding surface.

15. A method of manufacturing a semiconductor device comprising:
   forming one or more integrated circuits on a semiconductor substrate, including forming circuit features over said semiconductor substrate; and
   singulating said integrated circuits into dies comprising:
      removing said circuit features from a street located between said dies such that said semiconductor substrate is exposed, wherein;
      said removing is achieved using a first blade of a first grinding surface width having a grinding surface coated with an abrasive material comprising grit particles having a first median diameter; and cutting through said exposed semiconductor substrate using a second blade of a second grinding surface width smaller than the first grinding surface width, having a surface coated with an abrasive material comprising grit particles having a second median diameter smaller than the first median diameter.

16. The method recited in claim 15, wherein said grit particles being adhered to said first blade with a bonding agent having a hardness ranges from about 68 to about 80 (Rockwell B Hardness scale).

17. The method recited in claim 16, wherein said bonding agent comprises a bronze alloy.

18. The process recited in claim 15, wherein said removing also removes a portion of said semiconductor substrate.

19. The process recited in claim 18, wherein said portion comprises a thickness of said semiconductor substrate of less than about 5 microns.

* * * * *